US010473924B2

(12) United States Patent
Yoshida et al.

(10) Patent No.: US 10,473,924 B2
(45) Date of Patent: Nov. 12, 2019

(54) OPTICAL SCANNING DEVICE, MANUFACTURING METHOD OF OPTICAL SCANNING DEVICE, AND OPTICAL SCANNING CONTROL DEVICE

(71) Applicants: Yukihiro Yoshida, Tokyo (JP); Koji Takenaka, Tokyo (JP); Hisanori Aga, Tokyo (JP)

(72) Inventors: Yukihiro Yoshida, Tokyo (JP); Koji Takenaka, Tokyo (JP); Hisanori Aga, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 255 days.

(21) Appl. No.: 15/571,129

(22) PCT Filed: Apr. 22, 2016

(86) PCT No.: PCT/JP2016/062804
§ 371 (c)(1),
(2) Date: Nov. 1, 2017

(87) PCT Pub. No.: WO2016/194514
PCT Pub. Date: Dec. 8, 2016

(65) Prior Publication Data
US 2018/0172985 A1    Jun. 21, 2018

(30) Foreign Application Priority Data

May 29, 2015   (JP) .................................. 2015-109503

(51) Int. Cl.
*G02B 26/08*   (2006.01)
*G02B 26/12*   (2006.01)
*G02B 26/10*   (2006.01)

(52) U.S. Cl.
CPC ....... *G02B 26/129* (2013.01); *G02B 26/0858* (2013.01); *G02B 26/101* (2013.01)

(58) Field of Classification Search
CPC .............. G02B 26/129; G02B 26/0858; G02B 26/101; G02B 26/08; G02B 26/10; B81B 3/00
(Continued)

(56) References Cited

U.S. PATENT DOCUMENTS 7,821,694 B2 * 10/2010 Asai .................. G02B 26/0858
359/224.1
2008/0144154 A1   6/2008 Asai
(Continued)

FOREIGN PATENT DOCUMENTS

JP   2007-025608   2/2007
JP   2011-013270   1/2011
(Continued)

OTHER PUBLICATIONS

Japanese Office Action for 2015-109503 dated May 14, 2019.
(Continued)

*Primary Examiner* — Euncha P Cherry
(74) *Attorney, Agent, or Firm* — IPUSA, PLLC

(57) ABSTRACT

An optical scanning device that scans incident light by causing a mirror to oscillate is provided. The optical scanning device includes a displacement sensor for detecting a swing angle of the mirror and a temperature sensor used for temperature compensation of the displacement sensor. The displacement sensor is a piezoelectric sensor that has a structure in which a lower electrode, a piezoelectric film, and an upper electrode are layered in this order. The temperature sensor is a resistance type temperature measuring body that has a same layer structure as the lower electrode.

9 Claims, 10 Drawing Sheets

(58) Field of Classification Search
USPC .................................................... 359/213.1
See application file for complete search history.

(56) References Cited

U.S. PATENT DOCUMENTS

| | | |
|---|---|---|
| 2013/0083378 A1 | 4/2013 | Tanaka et al. |
| 2013/0301103 A1 | 11/2013 | Aimono |
| 2014/0085694 A1 | 3/2014 | Aga et al. |
| 2014/0268266 A1 | 9/2014 | Shimizu |
| 2014/0355087 A1 | 12/2014 | Hibiya et al. |
| 2015/0022871 A1 | 1/2015 | Naono |

FOREIGN PATENT DOCUMENTS

| | | |
|---|---|---|
| JP | 2013-011852 | 1/2013 |
| JP | 2013-092750 | 5/2013 |
| JP | 2013-200337 | 10/2013 |
| JP | 5402589 | 1/2014 |
| JP | 2014-082464 | 5/2014 |
| JP | 2014-182227 | 9/2014 |
| JP | 2015-022064 | 2/2015 |

OTHER PUBLICATIONS

Extended European search report for European Patent Application No. 16802951.0 dated Nov. 8, 2018.
International Search Report for PCT/JP2016/062804 dated Jun. 28, 2016.

\* cited by examiner (a)

(b)

OPTICAL SCANNING DEVICE, MANUFACTURING METHOD OF OPTICAL SCANNING DEVICE, AND OPTICAL SCANNING CONTROL DEVICE

BACKGROUND OF THE INVENTION

1. Field of the Invention

The present invention relates to an optical scanning device, a manufacturing method of the optical scanning device, and an optical scanning control device.

2. Description of the Related Art

An optical scanning control device is known which scans a laser beam to display an image. This optical scanning control device includes a first detector that directly detects light emitted from a light source without going through an optical system and a second detector that detects the light emitted from the light source after going through the optical system. Further, based on a combination of detection results by the first detector and the second detector, a determination of abnormality, etc., can be made (refer to, for example, Patent Document 1).

For example, an optical scanning control device that scans a laser beam may include, in an optical scanning device used for scanning the laser beam, a displacement sensor which detects a degree of tilt of a mirror used for scanning the laser beam. The optical scanning control device controls the mirror's swing angle based on an output of the displacement sensor.

However, in the case where the output of the displacement sensor has temperature dependency (depends on the temperature), there is a problem in that the optical scanning control device cannot accurately control the swing angle. Although a temperature sensor, such as a thermistor, used for compensation may be provided outside of the optical scanning device, temperature near the displacement sensor cannot be accurately detected because the temperature sensor cannot be provided in the vicinity of the displacement sensor, and thus, it is difficult to perform accurate temperature compensation.

CITATION LIST

Patent Document

[Patent Document 1] Japanese Unexamined Patent Application Publication No. 2013-11852

SUMMARY OF THE INVENTION

Technical Problem

In view of the above-described problem, an object of the present invention is to provide an optical scanning device that is capable of accurately compensating for the temperature dependency of the output of the displacement sensor.

Solution to Problem

According to an embodiment of the present invention, an optical scanning device (1) is provided which causes a mirror (310) to oscillate to scan incident light. The optical scanning device (1) includes displacement sensors (391, 395, 396) for detecting a swing angle of the mirror (310) and temperature sensors (397, 398, 399) used for temperature compensation of the displacement sensor (391, 395, 396). The displacement sensors (391, 395, 396) are piezoelectric sensors with a structure in which a lower electrode, a piezoelectric film, and an upper electrode are layered in this order. The temperature sensors (397, 398, 399) are resistance type temperature measuring bodies with the same layer structure as the lower electrode.

It should be noted that reference numerals in the above parentheses are just examples provided in order to facilitate easy understanding, and are not limited to aspects illustrated in the drawings.

Advantageous Effects of Invention

According to an embodiment of the present invention, it is possible to provide an optical scanning device that is capable of accurately compensating for the temperature dependency of outputs of the displacement sensors.

DETAILED DESCRIPTION OF THE PREFERRED EMBODIMENTS

Figure 1:
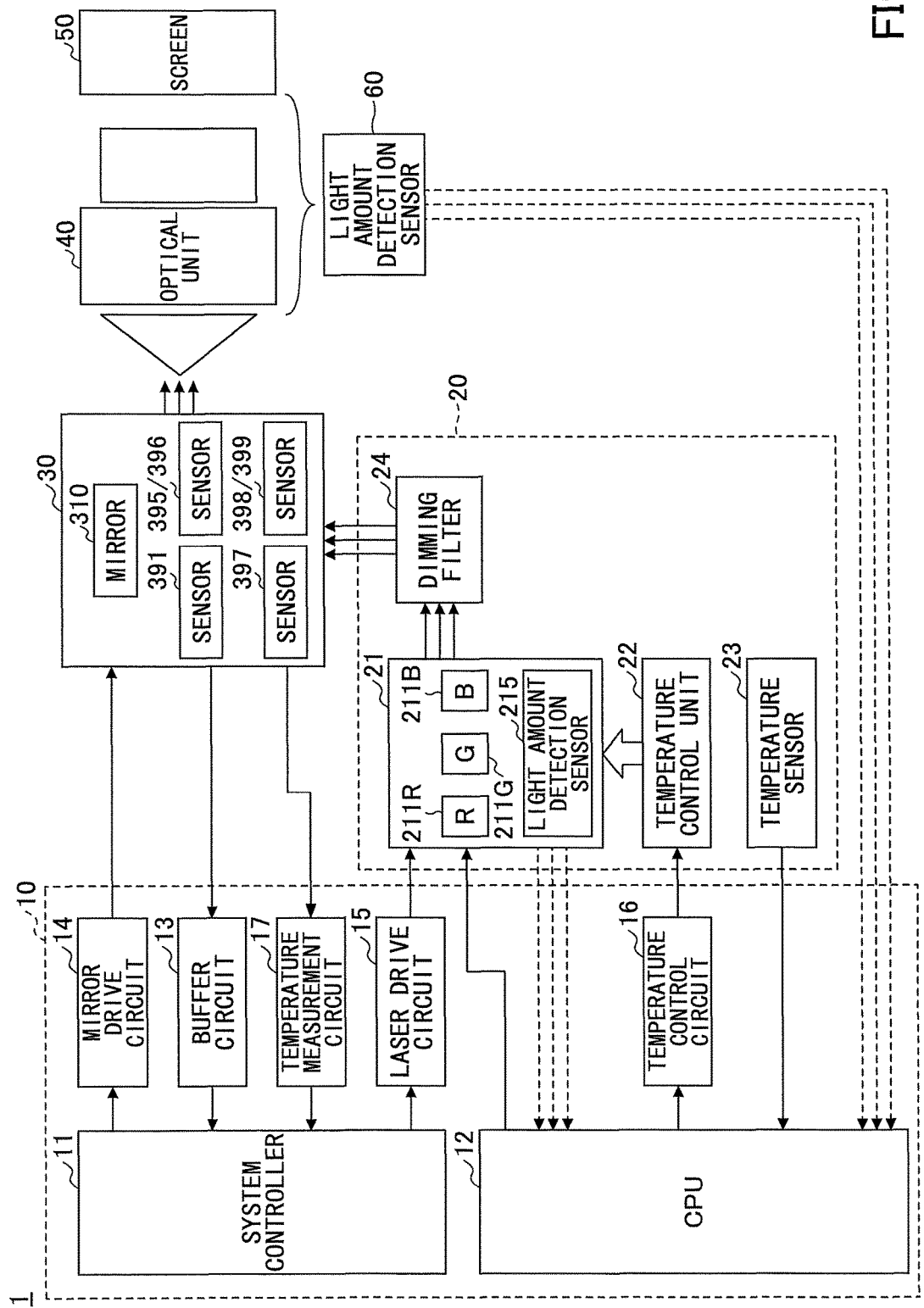
FIG. 1 is a block diagram illustrating an example of an optical scanning control device according to an embodiment of the present invention.

In the following, embodiments of the present invention will be described while making reference to the drawings. Throughout the drawings, a same reference numeral is given to a same element, and duplicated descriptions may be omitted.

Figure 2:
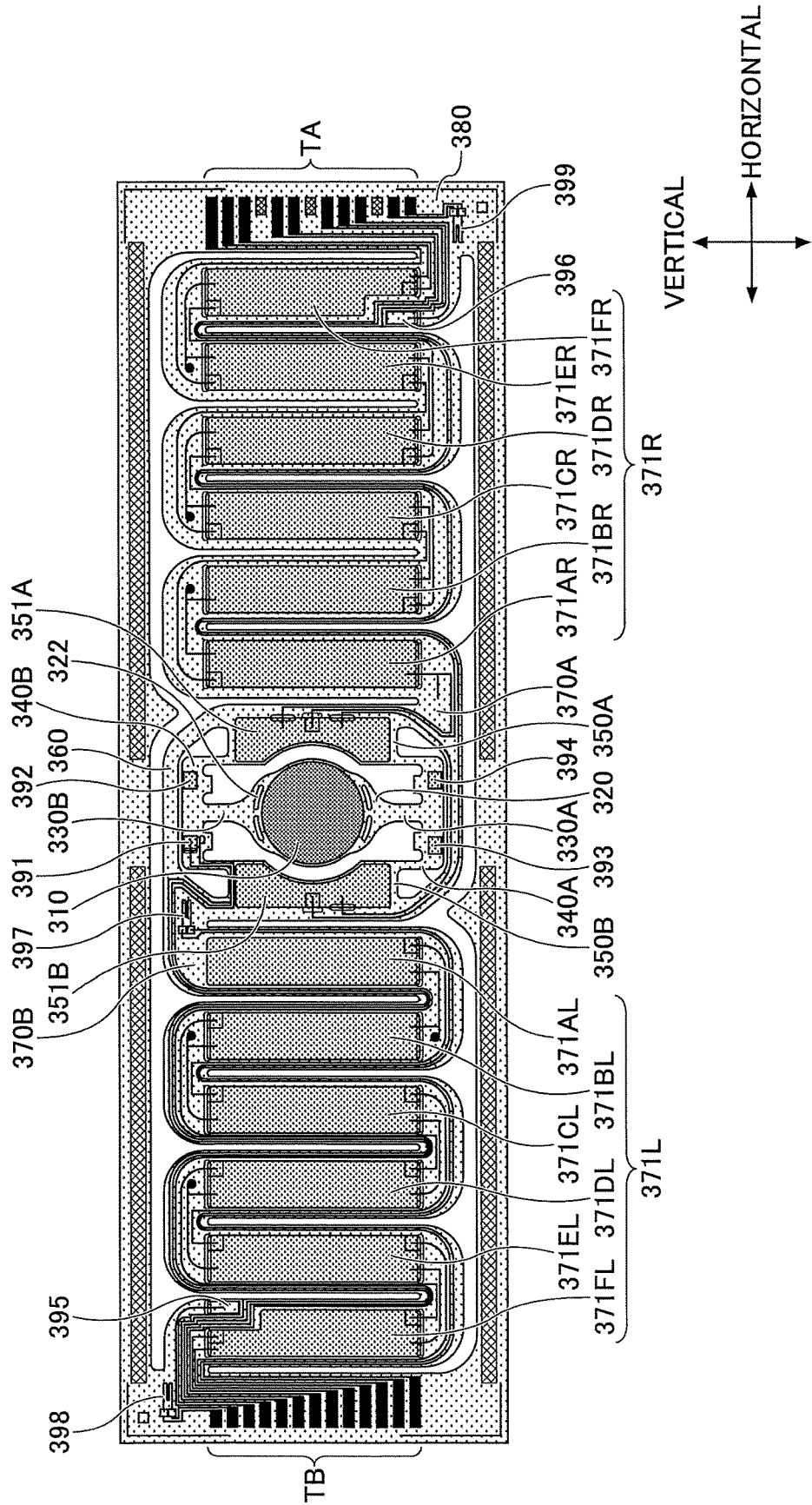
FIG. 2 is a plan view of an optical scanning device included in the optical scanning control device.
Figure 3:
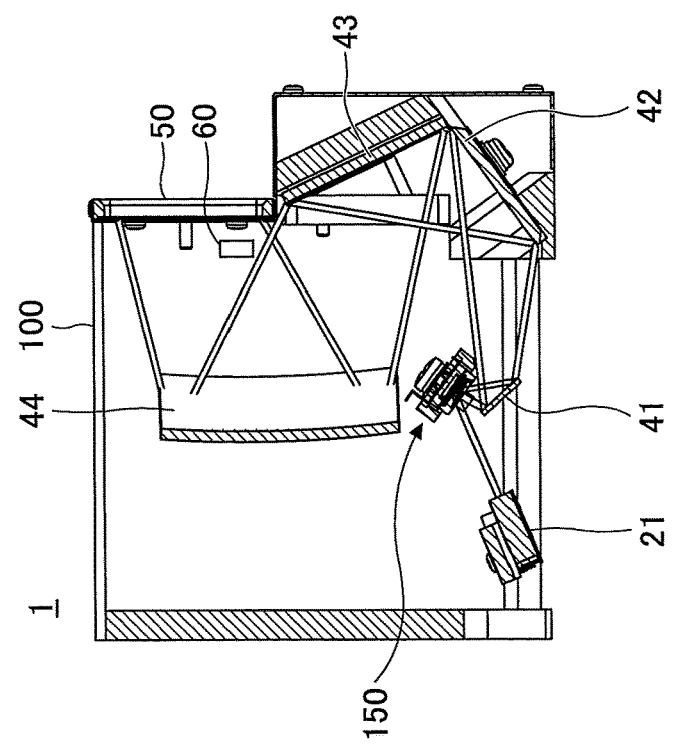
FIG. 3 is an external view (No. 1) illustrating an example of an optical scanning control device according to an embodiment of the present invention.
Figure 3:
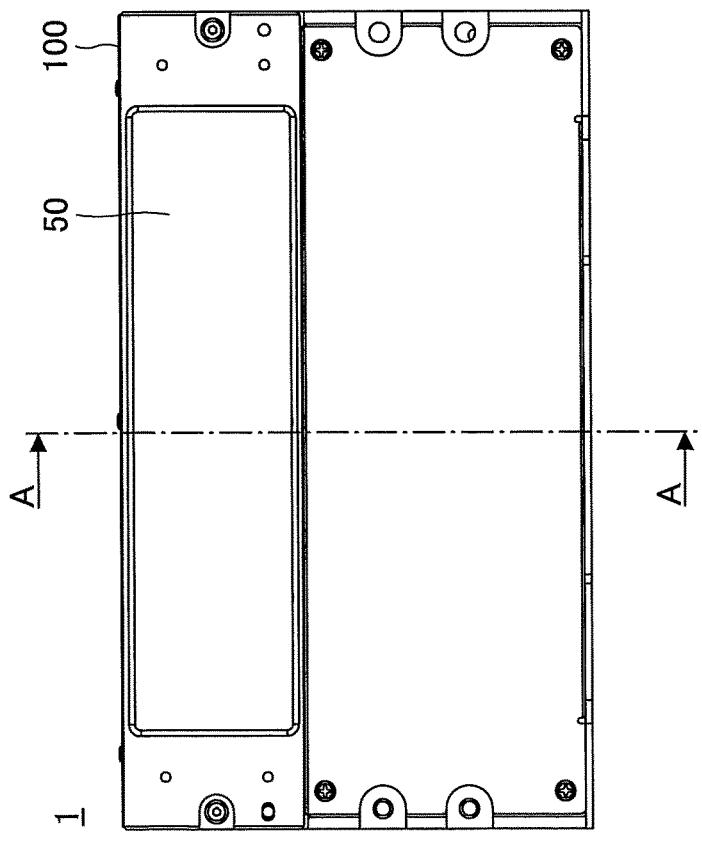
Figure 4:
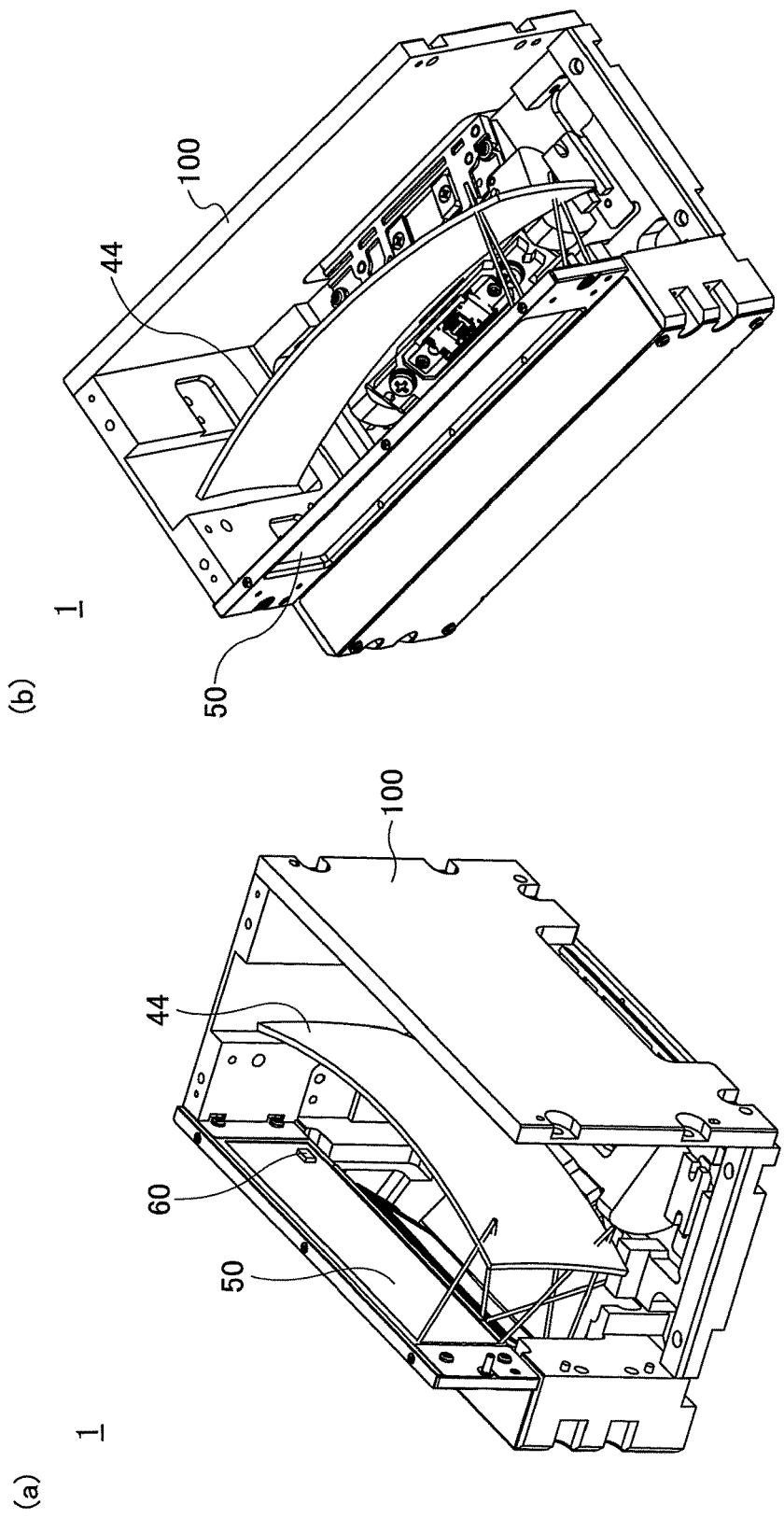
FIG. 4 is an external view (No. 2) illustrating an example of an optical scanning control device according to an embodiment of the present invention.

FIG. 1 is a block diagram illustrating an example of an optical scanning control device 1 according to an embodiment of the present invention. FIG. 2 is a plan view of an optical scanning device 30 included in the optical scanning control device 1. FIGS. 3 and 4 are external views illustrating examples of the optical scanning control device 1.

(Overall Structure of Optical Scanning Control Device)

First, referring to FIG. 1 through FIG. 4, an overall structure of the optical scanning control device 1 will be described. The optical scanning control device 1 includes, as main elements, a circuit unit 10, a light source unit 20, an optical scanning device 30, an optical unit 40, a screen 50, and a light amount detection sensor 60, which are included in a housing 100. The optical scanning control device 1 is, for example, a laser scanning projector.

The circuit unit 10 is a unit for controlling the light source unit 20 and the optical scanning device 30, and may include, for example, a system controller 11, a CPU (Central Processing Unit) 12, various drive circuits, and the like.

The light source unit 20 includes an LD module 21, a temperature control unit 22, a temperature sensor 23, and a dimming filter 24.

The LD module 21 includes lasers 211R, 211G, and 211B, whose emitted light amounts vary according to electric current values; an light amount detection sensor 215 that monitors the immediate light amount (immediately after the light is emitted) of each of the lasers 211R, 211G, and 211B; etc. The laser 211R is, for example, a red semiconductor laser, and is capable of emitting light with a wavelength λR (e.g., 640 nm). The laser 211G is, for example, a green semiconductor laser, and is capable of emitting light with a wavelength λG (e.g., 530 nm). The laser 211B is, for example, a blue semiconductor laser, and is capable of emitting light with a wavelength λB (e.g., 445 nm). As the light amount detection sensor 215, for example, a photodiode, etc., may be used. The light amount detection sensor 215 may be arranged at any position as long as it can detect the light amount before going through the dimming filter 24.

The temperature control unit 22 is capable of controlling the lasers 211R, 211G, and 211B to be a predetermined temperature. The temperature sensor 23 is capable of detecting temperatures of the lasers 211R, 211G, and 211B. As the temperature control unit 22, for example, a Peltier element may be used. As the temperature sensor 23, for example, a thermistor may be used.

The dimming filter 24 is arranged at the front stage of the mirror 310, and the light (mixed light) emitted from the lasers 211R, 211G, and 211B is incident on the dimming filter 24. The dimming filter 24 has a function for adjusting the brightness on the screen 50. As the dimming filter 24, a ND (Neutral Density) filter, a liquid crystal element, a polarization filter, or the like may be used. The dimming filter 24 is, for example, arranged in such a way that the dimming filter 24 is tilted with respect to an optical axis of the incident light, and the non-transmitted light (the light that does not go through the dimming filter 24) is absorbed or reflected by the dimming filter 24.

The optical scanning device 30 may be, for example, a MEMS (Micro Electro Mechanical Systems) that drives the mirror 310 by using a piezoelectric element. The mirror 310 functions as a scanning means for forming an image on the screen 50 by reflecting the incident light (mixed light) emitted from the lasers 211R, 211G, and 211B, and scanning the reflected incident light two-dimensionally in the horizontal direction and the vertical direction according to a video signal.

Specifically, as illustrated in FIG. 2, the optical scanning device 30 includes the mirror 310, a mirror support unit 320, twist beams 330A and 330B, connection beams 340A and 340B, drive beams 350A and 350B, a movable frame 360, drive beams 370A and 370B, and a fixed frame 380. Further, the drive beams 350A and 350B include drive sources 151A and 151B, respectively. Further, the drive beams 370A and 370B include drive sources 371R and 371L, respectively. The drive beams 350A and 350B and the drive beams 370A and 370B function as actuators that cause the mirror 310 to oscillate in an up-and-down direction and in a left-and-right direction and to scan the laser light.

In the mirror support unit 320, slits 322 are formed along the circumference of the mirror 310. Thanks to the slits 322, not only the weight of the mirror support unit 320 can be reduced, but also a stress, which is generated when the twisting caused by the twist beams 330A and 330B is transmitted to the mirror 310, can be reduced.

In the optical scanning device 30, the mirror 310 is supported by an upper surface of the mirror support unit 320, and the mirror support unit 320 is connected to end portions of the twist beams 330A and 330B that are disposed on both sides of the mirror support unit 320. An oscillation axis is formed by the twist beams 330A and 330B. The twist beams 330A and 330B are disposed in the oscillation axis direction and support the mirror support unit 320 from both sides in the axial direction. The twisting of the twist beams 330A and 330B causes the mirror 310, which is supported by the mirror support unit 320, to oscillate, and the light, which has been emitted to the mirror 310 and reflected by the mirror 310, is caused to be scanned. The twist beams 330A and 330B are connected to and supported by the connection beams 340A and 340B, and connected to the drive beams 350A and 350B.

The drive beams 350A and 350B, the connection beams 340A and 340B, the twist beams 330A and 330B, the mirror support unit 320, and the mirror 310 are surrounded by the movable frame 360. One side of each of the drive beams 350A and 350B is supported by the movable frame 360. The other side of the drive beam 350A extends to the inner circumference side and is connected to the connection beams 340A and 340B. Similarly, the other side of the drive beam 350B extends to the inner circumference side and is connected to the connection beams 340A and 340B.

The drive beams 350A and 350B are provided as a pair in such a way that the mirror 310 and the mirror support unit 320 are sandwiched by the drive beams 350A and 350B in a direction orthogonal to the twist beams 330A and 330B. The drive sources 351A and 351B are formed on the surfaces of the drive beams 350A and 350B, respectively. The drive sources 351A and 351B are piezoelectric elements with a structure in which a lower electrode, a piezoelectric film (PZT film, etc.), and an upper electrode are layered in this order on the surfaces of the drive beams 350A and 350B. The drive sources 351A and 351B expands and contracts according to the polarity of drive voltages applied to the upper electrodes and the lower electrodes.

Therefore, by alternately applying drive voltages that have phases different from each other to the drive beam 350A and the drive beam 350B, the drive beam 350A and the drive beam 350B, disposed on the left side and the right side of the mirror 310, are caused to oscillate in an up-and-down direction opposite to each other. According to this operation, it is possible to cause the mirror 310 to oscillate around the twist beams 330A, 330B as an oscillation axis or a rotational axis. Hereinafter, the direction, in which the mirror 310 oscillates around the axis of the twist beams 330A and 330B, is referred to as a horizontal direction. Resonance vibration, for example, may be used for the horizontal drive by the drive beams 350A and 350B, and may be used for quickly driving the mirror 310 to oscillate.

As described above, the drive beams 350A and 350B are horizontal drive beams that include the drive sources 351A and 351B as horizontal drive sources for causing the mirror 310 to oscillate in the horizontal direction.

Further, one end of each of the drive beams 370A and 370B is connected to the outside of the movable frame 360. The drive beams 370A and 370B are provided as a pair in such a way that the movable frame 360 is sandwiched from the left side and the right side by the drive beams 370A and 370B. The drive beam 370A has a zigzag shape as a whole by having each of the beams, which are disposed extending in a direction parallel to the drive beam 350A, connected to an adjacent beam at an end portion. Further, the other end of the drive beam 370A is connected to the inside of the fixed frame 380. Similarly, the drive beam 370B has a zigzag shape as a whole by having each of the beams, which are disposed extending in a direction parallel to the drive beam 350B, connected to an adjacent beam at an end portion. Further, the other end of the drive beam 370B is connected to the inside of the fixed frame 380.

On the surfaces of the drive beams 370A and 370B, drive sources 371R and 371L are formed as rectangle units that do not include curved portions, respectively. The drive sources 371R and 371L are piezoelectric elements with a structure in which a lower electrode, a piezoelectric film, and an upper electrode are layered in this order on the surfaces of the drive beams 370A and 370B.

By applying drive voltages that have polarities different from each other to adjacent rectangle units of drive sources 371R and 371L, the drive beams 370A and 370B cause adjacent rectangle beams to warp in up-and-down directions opposite to each other, and transmit accumulated up-and-down movements of the rectangle beams to the movable frame 360. According to this operation, the drive beams 370A and 370B cause the mirror 310 to oscillate in a vertical direction that is orthogonal to the parallel direction. For example, non-resonant vibration may be used for the vertical drive by the drive beams 370A and 370B.

For example, the drive source 371R includes drive sources 371AR, 371BR, 371CR, 371DR, 371ER, and 371FR that are disposed in series from the movable frame 360 side toward the right side. Further, the drive source 371L includes drive sources 371AL, 371BL, 371CL, 371DL, 371EL, and 371FL that are disposed in series from the movable frame 360 side toward the left side. In this case, by driving the drive sources 371AR, 371AL, 371CR, 371CL, 371ER, and 371EL with a first same waveform voltage, and by driving the drive sources 371BR, 371BL, 371DR, 371DL, 371FR, and 371FL with a second same waveform voltage different from the first same waveform voltage, it is possible to oscillate in the vertical direction.

As described above, the drive beams 370A and 370B are vertical drive beams that include the drive sources 371R and 371L as vertical drive sources for causing the mirror 310 to oscillate in the vertical direction.

Drive wires used for applying drive voltages to an upper electrode and a lower electrode of the drive source 351A are connected to predetermined terminals included in a group of terminals TA disposed on the fixed frame 380. Further, drive wires used for applying drive voltages to an upper electrode and a lower electrode of the drive source 351B are connected to predetermined terminals included in a group of terminals TB disposed on the fixed frame 380. Further, drive wires used for applying drive voltages to an upper electrode and a lower electrode of the drive source 371R are connected to predetermined terminals included in a group of terminals TA disposed on the fixed frame 380. Further, drive wires used for applying drive voltages to an upper electrode and a lower electrode of the drive source 371L are connected to predetermined terminals included in a group of terminals TB disposed on the fixed frame 380.

The optical scanning device 30 includes a horizontal displacement sensor 391 that detects a tilted degree of the mirror 310 in the horizontal direction (swing angle in the horizontal direction) in a state where the drive voltages are applied to the drive sources 351A and 351B and where the mirror 310 is caused to oscillate in the horizontal direction. In the vicinity of the horizontal displacement sensor 391, a temperature sensor 397 is provided which is used for detecting a temperature of the vicinity of the horizontal displacement sensor 391 and is used for temperature compensation of the horizontal displacement sensor 391.

The optical scanning device 30 includes vertical displacement sensors 395 and 396 that detect a tilted degree of the mirror 310 in the vertical direction (swing angle in the vertical direction) in a state where the drive voltages are applied to the drive sources 371R and 371L and where the mirror 310 is caused to oscillate in the vertical direction. In the vicinity of the vertical displacement sensor 395, a temperature sensor 398 is provided which is used for detecting a temperature of the vicinity of the vertical displacement sensor 395 and is used for temperature compensation of the vertical displacement sensor 395. Further, in the vicinity of the vertical displacement sensor 396, a temperature sensor 399 is provided which is used for detecting a temperature of the vicinity of the vertical displacement sensor 396 and is used for temperature compensation of the vertical displacement sensor 396.

As described above, in the optical scanning device 30, a plurality of displacement sensors and a plurality of temperature sensors are arranged in such a way that each of the displacement sensors is assigned to a corresponding temperature sensor. Further, an output of each of the temperature sensors is input to a temperature measurement circuit 17 that is provided outside of the optical scanning device 30. The temperature measurement circuit 17 measures a temperature of each of the displacement sensors (temperature of the vicinity of each of the displacement sensors) based on a resistance value of each of the temperature sensors.

It should be noted that, for example, in a unit 150 (refer to FIG. 3(b)), the optical scanning device 30 is mounted on a ceramic package together with a drive circuit, etc., and is covered by a ceramic cover.

The optical unit 40 is an optical system used for projecting the scanned light on the screen 50, which is scanned by the optical scanning device 30. As illustrated in FIG. 3(b), etc., the optical unit 40 may include a reflection mirror 41, a reflection mirror 42, a reflection mirror 43, a concave mirror 44, etc. It should be noted that a lens may be used instead of a reflection mirror if necessary. The light, which has entered the optical unit 40 from the light scanning unit 30, is caused to be approximately parallel light by the concave mirror 44 so as to form an image on the screen 50. The image in accordance with an image signal is drawn on the screen 50.

The screen 50 is, for example, provided with a micro lens array for removing noise on an image, which may be seen as granular referred to as speckle. In this case, each of the micro lenses included in the micro lens array corresponds to a pixel of a display. It is preferable that an emitted laser beam be equal to or less than a size of the micro lens.

The light amount detection sensor 60 may be arranged at any position as long as it can detect the light amount after going through the dimming filter 24. The light amount detection sensor 60 is capable of independently detecting each of the light amounts of the lasers 211R, 211G, and 211B after going through the dimming filter 24. As the light amount detection sensor 60, for example, one or more photodiodes, etc., may be used.

(Overall Operation of Optical Scanning Control Device)

Next, an overall operation of the optical scanning control device 1 will be described. The system controller 11 is capable of, for example, controlling a swing angle of the mirror 310. The system controller 11 monitors, for example, a tilt of the mirror 310 in the horizontal direction and vertical direction obtained by the horizontal displacement sensor 391 and the vertical displacement sensors 395 and 396 via a buffer circuit 13. Further, the system controller 11 monitors an output of the temperature measurement circuit 17 that measures temperatures of the horizontal displacement sensor 391, and the vertical displacement sensors 395 and 396 based on the corresponding resistance values of the temperature sensors 397-399.

Further, the system controller 11 is enabled to generate a signal by applying temperature compensation to outputs of the horizontal displacement sensor 391, and the vertical displacement sensors 395 and 396 based on outputs of the temperature measurement circuit 17, and supply the generated signal to a mirror drive circuit 14 as an angle control signal. Further, based on the angle control signal from the system controller 11, the mirror drive circuit 14 is enabled to drive (for scanning) the mirror 310 for a predetermined angle by supplying predetermined signals to the drive beams 350A and 350B, and drive beams 370A and 370B.

Further, the system controller 11 is enabled to supply, for example, a digital video signal to a laser drive circuit 15. Further, the laser drive circuit 15 supplies predetermined electric currents to the lasers 211R, 211G, and 211B based on the video signal from the system controller 11. According to the above operations, it is possible for the lasers 211R, 211G, and 211B to respectively emit red light, green light, and blue light that are modulated based on the video signal, and it is possible to form a color image by mixing them.

A CPU 12 is enabled to supply a light amount control signal to the LD module 21 by, for example, monitoring originally emitted light amounts of the lasers 211R, 211G, and 211B (immediately after emission of the laser light) based on outputs of the light amount detection sensor 215. Electric currents applied to the lasers 211R, 211G, and 211B are controlled based on the light amount control signal from the CPU 12 so as to achieve predetermined outputs (light amounts).

It should be noted that the light amount detection sensor 215 may include three sensors for independently detecting the light amounts emitted from the lasers 211R, 211G, and 211B. Alternatively, the light amount detection sensor 215 may include only a single sensor. In this case, it is possible to control the amounts of the lights emitted from the lasers 211R, 211G, and 211B by causing the lasers 211R, 211G, and 211B to sequentially emit the light and sequentially detecting the light amount with the single sensor.

Further, the CPU 12 is enabled to supply a temperature control signal to a temperature control circuit 16 by monitoring temperatures of the lasers 211R, 211G, and 211B based on outputs of the temperature sensor 23. Further, the temperature control circuit 16 supplies a predetermined electric current to the temperature control unit 22. According to the above operations, the temperature control unit 22 is heated or cooled, and it is possible to control each laser to be a predetermined temperature.

The light amount detection sensor 60 detects a light amount after going through the dimming filter 24. As described above, the light amount detection sensor 215, which is used for adjusting the light amounts of the lasers, is implemented in the LD module 21, and detects originally emitted light amounts of the lasers 211R, 211G, and 211B (light amounts before going through the dimming filter 24). However, because an actual image displayed by the optical scanning control device 1 is based on the light projected on the screen 50, there may be a case where it is difficult to perform correct adjustment if the adjustment is based on the originally emitted laser light amounts.

For example, because the dimming filter 24 is provided on the light route, there may be a case in which an expected dimming rate is not obtained due to the characteristics of the dimming filter 24, and the light amount after going through the dimming filter 24 is not as expected. Further, in a case where there are variations among the R/G/B dimming rates of the dimming filter 24, there is a risk of collapsed white balance after going through the dimming filter 24. Further, there may be a case in which characteristics of the optical scanning device 30 fluctuate due to the temperature or the aging. The above-described problems cannot be solved even if the light amount before going through the dimming filter 24 is very precisely controlled by the light amount detection sensor 215 in the optical scanning device 30.

Therefore, in the optical scanning control device 1, as a light amount detection means for detecting the light amount after going through the dimming filter 24, the light amount detection sensor 60 is provided. A detection result of the light amount detection sensor 60 is input to the CPU 12 as a control means. The CPU 12 is enabled to supply a light amount control signal for controlling an electric current value of each laser to the LD module 21 based on the light amount detected by the light amount detection sensor 60.

According to the above operations, it is possible to detect the light amount of the laser light in which the fluctuations of the characteristics of the dimming filter 24 and the optical scanning device 30 are taken into account, and thus, it is possible to perform accurate light amount control corresponding to an actual image displayed on the screen 50. It should be noted that the light amount detection sensor 60 is enabled to independently detect each of the light amounts of the lasers 211R, 211G, and 211B, and the CPU 12 is enabled to control an electric current value of each laser based on the corresponding light amount detected by the light amount detection sensor 60.

(Temperature Dependency of Displacement Sensor, and Compensation Thereof)

Figure 5:
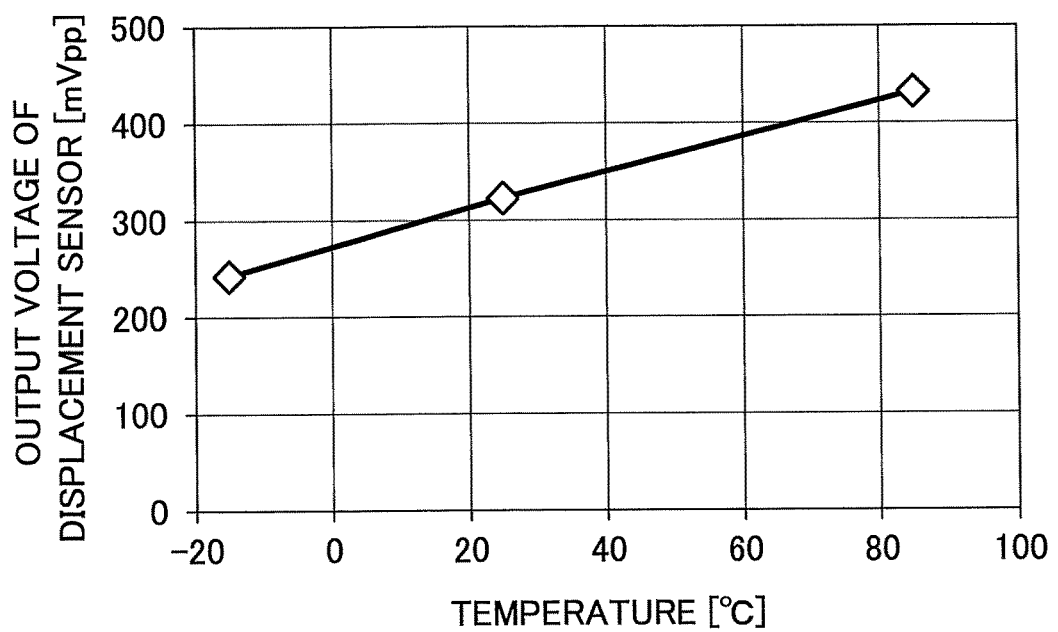
FIG. 5 is a drawing illustrating temperature dependency of a displacement sensor.

In the case where a piezoelectric sensor (piezoelectric element) is used as a horizontal displacement sensor or a vertical displacement sensor, the displacement sensor has a temperature dependency, for example, as illustrated in FIG. 5. In an example of FIG. 5, characteristics are illustrated in which an output voltage of the displacement sensor increases as the temperature increases.

Conventionally, because displacement detection cannot be performed accurately if the displacement sensor has a temperature dependency, a thermistor is implemented in a ceramic package on which the optical scanning device 30 is mounted and temperature compensation of the displacement sensor is performed based on an output of the thermistor. In the conventional method, it is difficult to arrange the displacement sensor and the thermistor close to each other, and thus, a temperature of the vicinity of the displacement sensor cannot be accurately detected.

Therefore, in an embodiment of the present invention, temperature sensors 397-399 are implemented in the optical scanning device 30, and thus, it is possible to accurately detect a temperature of the vicinity of each of the displacement sensors. With respect to the above, the detail will be described below.

(Horizontal Displacement Sensor and Temperature Sensor)

Figure 6:
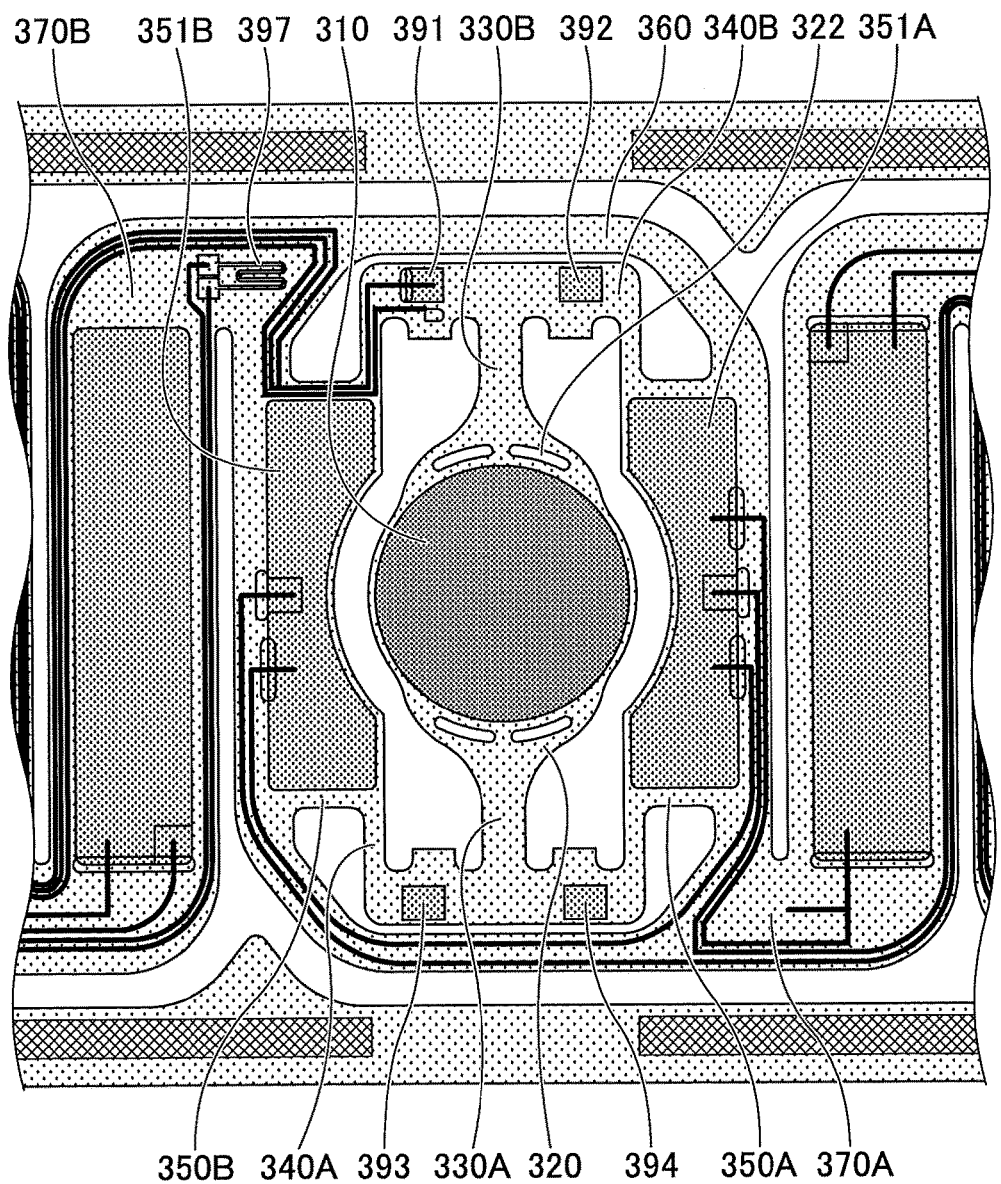
FIG. 6 is an enlarged partial plan view of a vicinity of a horizontal displacement sensor 391 and a temperature sensor 397.

FIG. 6 is an enlarged partial plan view of a vicinity of the horizontal displacement sensor 391 and the temperature sensor 397. In an embodiment of the present invention, a piezoelectric sensor is used as the horizontal displacement sensor 391.

The horizontal displacement sensor 391 is provided on the drive source 351B side of a connection portion between the twist beam 330B and the connection beam 340B, and outputs an electric current value corresponding to a displacement of the connection beam 340B transmitted from the twist beam 330B in accordance with a tilt degree of the mirror 310 in the horizontal direction. Further, dummy sensors 392, 393, and 394, which have the same layer structures as the horizontal displacement sensor 391, are provided in order to keep weight balance of the connection beams 340A and 340B. The dummy sensor 392 is provided on the drive source 351A side of the connection portion between the twist beam 330B and the connection beam 340B, the dummy sensor 393 is provided on the drive source 351B side of a connection portion between the twist beam 330A and the connection beam 340A, the dummy sensor 394 is provided on the drive source 351A side of the connection portion between the twist beam 330A and the connection beam 340A. It should be noted that, in the present specification, "the same layer structure (layer structures are the same)" means that the materials included in each layer are the same and the thicknesses of each layer are the same.

The horizontal displacement sensor 391 and the dummy sensor 392 have a structure in which a lower electrode, a piezoelectric film, and an upper electrode are layered in this order on the upper surface of the connection beam 340B. Further, the dummy sensor 393 and the dummy sensor 394 have a structure in which a lower electrode, a piezoelectric film, and an upper electrode are layered in this order on the upper surface of the connection beam 340A. For the horizontal displacement sensor 391, wiring is provided which is connected to a predetermined terminal included in a terminal group TB arranged in the fixed frame 380. However, for the dummy sensors 392, 393, and 394, wiring is not provided because outputs of the dummy sensors 392, 393, and 394 are not used.

Figure 7:
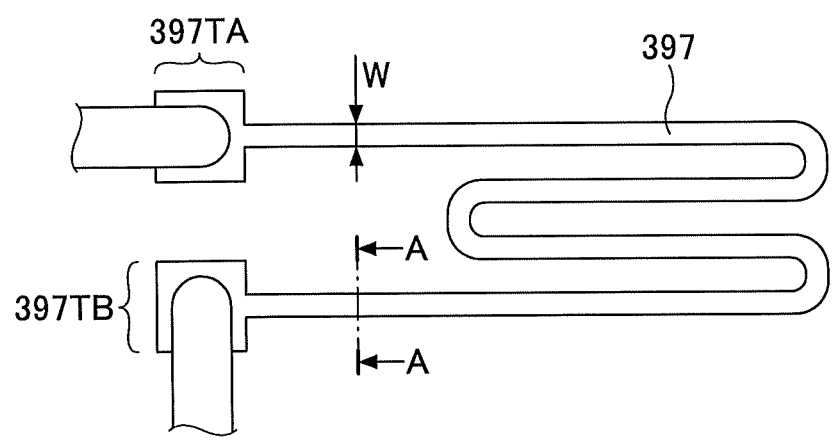
FIG. 7 is a drawing illustrating an example of the temperature sensor 397.
Figure 7:
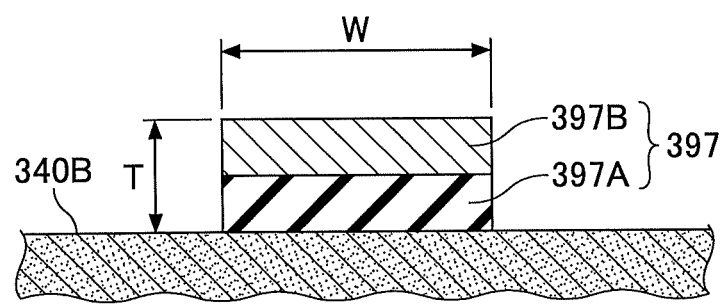

FIG. 7 includes drawings illustrating an example of the temperature sensor 397. FIG. 7(a) is a plan view, FIG. 7(b) is a sectional view along an A-A line of FIG. 7(a). As illustrated in FIG. 7, the temperature sensor 397 is a resistance type temperature measuring body that has a meandering pattern wiring with a predetermined wiring length in which a wiring thickness T and a wiring width W are substantially constant, and has a structure in which a first layer 397A and a second layer 397B are layered in this order on an upper surface of the connection beam 340B. A terminal 397TA and a terminal 397TB are respectively formed at the ends of the meandering pattern of the temperature sensor 397. The terminal 397TA and the terminal 397TB are connected to the wiring which leads to the terminal group TB.

It should be noted that the meandering pattern is an example. The temperature sensor 397 may have any pattern as long as a required wiring length can be secured. For example, the temperature sensor 397 may have a straight line pattern. The same discussion can be applied to the other temperature sensors.

In an embodiment of the present invention, layered structures of the first layer 397A and the second layer 397B are the same as a layer structure of a lower electrode of the horizontal displacement sensor 391 and as layer structures of lower electrodes of the drive sources 351A, 351B, 371R, and 371L, which are piezoelectric elements. As the first layer 397A, for example, a lanthanum nickel oxide (LNO) may be used, which is a conductive oxide. The thickness of the first layer 397A may be, for example, about 10-100 nm. Further, as the second layer 397B, for example, platinum (Pt) may be used, which is a metal. The thickness of the second layer 397B may be, for example, about 50-200 nm.

In this case, the lower electrode of the horizontal displacement sensor 391, the lower electrodes of the drive sources 351A, 351B, 371R, and 371L, which are piezoelectric elements, also have a layered structure of lanthanum nickel oxide (LNO) and platinum (Pt) are layered. It should be noted that an insulating film made of alumina ($Al_2O_3$) may be formed on a surface of the temperature sensor 397 and may be used for coating the layered structures of the first layer 397A and the second layer 397B.

As described above, by causing the layer structure of the temperature sensor 397 to be the same as the layer structure of the lower electrode of the horizontal displacement sensor 391 and as the layer structures of the drive sources 351A, 351B, 371R, and 371L, which are piezoelectric elements, it is possible to perform patterning of the temperature sensor 397 at the same time in a process (step) of forming the lower electrode of the horizontal displacement sensor 391, and the lower electrodes of the drive sources 351A, 351B, 371R, and 371L, which are piezoelectric elements. Therefore, it is possible to produce the temperature sensor 397 without increasing the number of manufacturing processes. Further, the patterning of the dummy sensors 392, 393, and 394 can be performed at the same time as the patterning of the temperature sensor 397. As a result, it is possible to realize cost cutting with respect to the optical scanning device 30.

Further, by forming the temperature sensor 397 on the same plane as the horizontal displacement sensor 391 (on the surface of the connection beam 340B) in the vicinity of the horizontal displacement sensor 391, it is possible to detect the temperature of the vicinity of the horizontal displacement sensor 391 more accurately than before.

(Vertical Displacement Sensor and Temperature Sensor)

Figure 8:
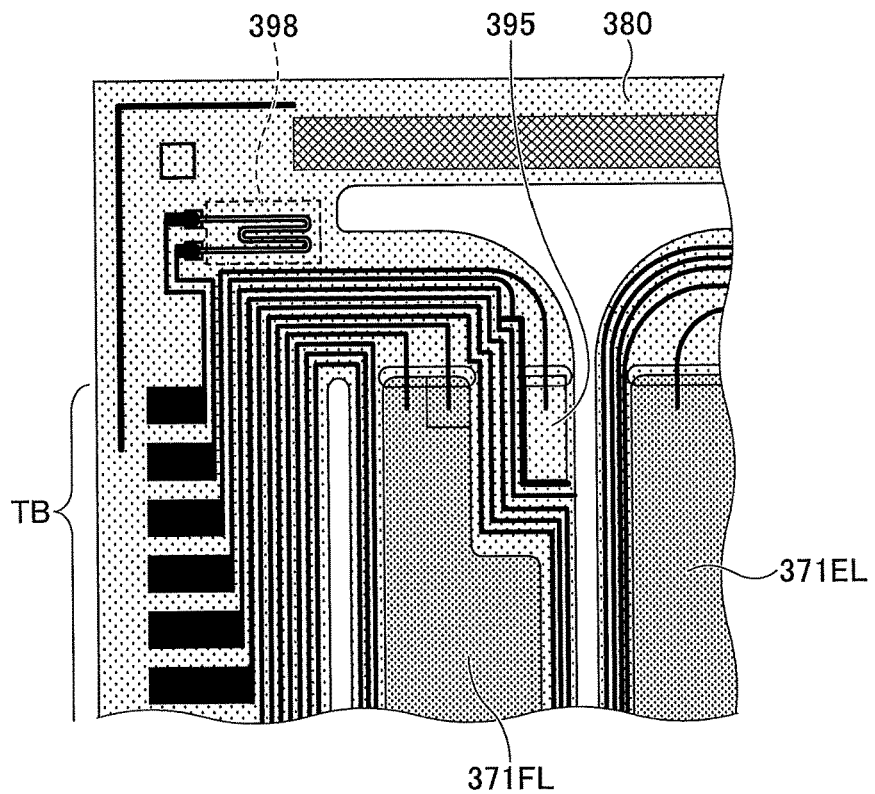
FIG. 8 is an enlarged partial plan view of a vicinity of a vertical displacement sensor 395 and a temperature sensor 398.

FIG. 8 is an enlarged partial plan view of a vicinity of the vertical displacement sensor 395 and the temperature sensor 398. In an embodiment of the present invention, a piezoelectric sensor is used as the vertical displacement sensor 395.

The vertical displacement sensor 395 is provided in an upper end portion of a rectangle beam included in the drive beam 370B, and, in accordance with a tilt degree of the mirror 310 in the vertical direction, outputs an electric current value corresponding to a displacement of the rectangle beam, of the drive beam 370B, in which the vertical displacement sensor 395 is provided. The vertical displacement sensor 395 has a structure in which a lower electrode, a piezoelectric film, and an upper electrode are layered in this order on an upper surface of the drive beam 370B. For the vertical displacement sensor 395, wiring is formed which is connected to a predetermined terminal included in the terminal group TB arranged in the fixed frame 380. It should be noted that a layer structure of the vertical displacement sensor 395 is the same as the horizontal displacement sensor 391. For example, the layer structure of the vertical displacement sensor 395 is a layered structure of lanthanum nickel oxide (LNO) and platinum (Pt).

Similar to the temperature sensor 397 illustrated in FIG. 7, the temperature sensor 398 has a meandering pattern wiring with a predetermined wiring length in which a wiring thickness T and a wiring width W are substantially constant. The temperature sensor 398 is formed on a surface of an upper end portion of a rectangle beam included in the drive beam 370B. The temperature sensor 398 is a resistance type temperature measuring body that has the same layer structure as the temperature sensor 397 (i.e., the same layer structure as the lower electrode of the vertical displacement sensor 395). Terminals are formed at the ends of the meandering pattern of the temperature sensor 398, and each of the terminals is connected to wiring which leads to the terminal group TB.

It should be noted that, referring to FIG. 8, only the vertical displacement sensor 395 and the temperature sensor 398 have been described. However, the vertical displacement sensor 396 also has the same structure as the vertical displacement sensor 395 and is provided in a lower end portion of a rectangle beam included in the drive beam 370A. Further, the vertical displacement sensor 396 outputs an electric current value corresponding to a displacement of the rectangle beam, of the drive beam 370A, in which the vertical displacement sensor 396 is provided, in accordance with a tilt degree of the mirror 310 in the vertical direction.

Further, the temperature sensor 399 has a structure similar to the temperature sensor 398, and is provided in the vicinity of the vertical displacement sensor 396 in the lower end portion of the rectangle beam included in the drive beam 370A. For each of the vertical displacement sensor 396 and the temperature sensor 399, wiring is formed which is connected to a predetermined terminal included in the terminal group TA arranged in the fixed frame 380. It should be noted that the terminal groups TA and TB are connected to the circuit unit 10 via, for example, a flexible cable or the like.

As described above, by causing the layer structures of the temperature sensors 398 and 399 to be the same as the layer structures of the lower electrodes of the vertical displacement sensors 395 and 396, and as the layer structures of the drive sources 351A, 351B, 371R, and 371L, which are piezoelectric elements (also the same as the layer structure of the lower electrode of the horizontal displacement sensor 391), it is possible to perform patterning of the temperature sensors 398 and 399 at the same time in a process (step) of forming the lower electrodes of the vertical displacement sensors 395 and 396, and the lower electrodes of the drive sources 351A, 351B, 371R, and 371L, which are piezoelectric elements. Therefore, it is possible to produce the temperature sensors 398 and 399 without increasing the number of manufacturing processes, and it is possible to realize the cost cut of the optical scanning device 30.

Further, by forming the temperature sensor 398 on the same plane as the vertical displacement sensor 395 (on the surface of the drive beam 370B) in the vicinity of the vertical displacement sensor 395, it is possible to detect the temperature of the vicinity of the vertical displacement sensor 395 more accurately than before. Further, by forming the temperature sensor 399 on the same plane as the vertical displacement sensor 396 (on the surface of the drive beam 370A) in the vicinity of the vertical displacement sensor 396, it is possible to detect the temperature of the vicinity of the vertical displacement sensor 396 more accurately than before.

(Temperature Measurement Circuit)

Figure 9:
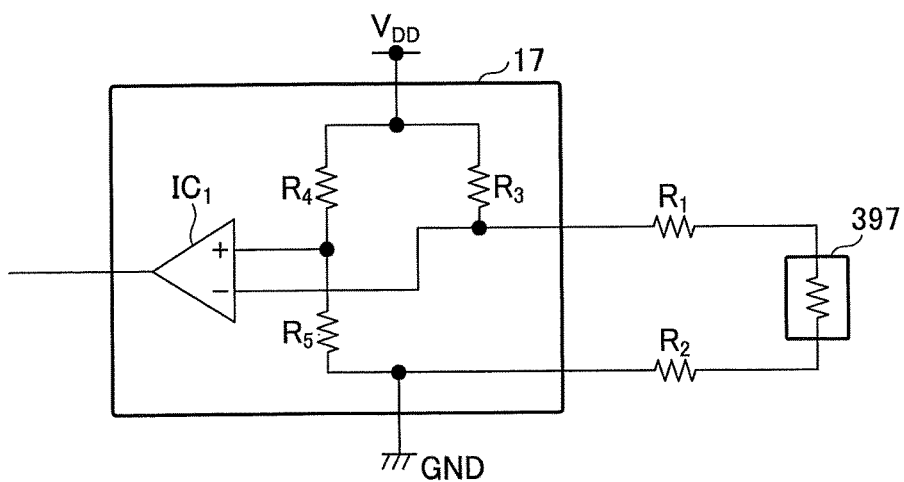
FIG. 9 is a drawing illustrating an example of a temperature measurement circuit 17.

FIG. 9 is a drawing illustrating an example of a temperature measurement circuit 17. As illustrated in FIG. 9, the temperature sensor 397 is connected to the temperature measurement circuit 17, and an output of the temperature measurement circuit 17 is input to the system controller 11 (refer to FIG. 1). The temperature measurement circuit 17 is a two-conductor type temperature measurement circuit.

Specifically, one end of the temperature sensor 397 is input to a minus terminal of an $IC_1$ (differential amplifier) of the temperature measurement circuit 17 via wiring that has resistance $R_1$. Further, the other end of the temperature sensor 397 is connected to a GND terminal of the temperature measurement circuit 17 via wiring that has resistance $R_2$.

The minus terminal of the IC' is connected to a power supply terminal $V_{DD}$ via pull-up resistance $R_3$. Further, a plus terminal of the $IC_1$ is connected to the power supply terminal $V_{DD}$ via pull-up resistance $R_4$, and is connected to the GND terminal via pull-down resistance $R_5$.

In FIG. 9, for example, the temperature sensor 397 may be a resistance body whose resistance is 100Ω at 0° C. Further, the resistances $R_3$, $R_4$, and $R_5$ may be 100Ω. Further, by arranging the temperature sensor 397 at a short distance from the temperature measurement circuit 17, it can be assumed that resistance $R_1$=resistance $R_2$≈0Ω, and thus, a bridge circuit may be formed by the temperature sensor 397, and resistances $R_3$, $R_4$, and $R_5$. Further, when the resistance of the temperature sensor 397 changes depending on the temperature, an output of the $IC_1$ changes accordingly, and thus, it becomes possible for the system controller 11 to detect the temperature by monitoring the output of the $IC_1$.

It should be noted that values of resistances $R_1$ and $R_2$ cannot be ignored in the case where it is difficult to arrange the temperature sensor 397 at a short distance from the temperature measurement circuit 17. In that case, by using a three-conductor type temperature measurement circuit or a four-conductor type temperature measurement circuit as the temperature measurement circuit 17, it becomes possible to accurately perform temperature measurement without receiving affections of the resistances $R_1$ and $R_2$.

EXAMPLES

By using a sputtering method, layered structures made of lanthanum nickel oxide (LNO) having thickness 30 nm and platinum (Pt) having thickness 150 nm were produced as the lower electrode of the horizontal displacement sensor 391, the lower electrodes of the vertical displacement sensors 395 and 396, and the lower electrodes of the drive sources 351A, 351B, 371R, and 371L. In a process the same as the above, by using the sputtering method, layered structures made of lanthanum nickel oxide (LNO) having thickness 30 nm and platinum (Pt) having thickness 150 nm were produced as the temperature sensors 397-399. Afterwards, by using the sputtering method, piezoelectric films and upper electrodes were layered in this order on top of the lower electrodes of the horizontal displacement sensor 391, the vertical displacement sensors 395 and 396, and the drive sources 351A, 351B, 371R, and 371L, which were piezoelectric elements. It should be noted that the positions, at which the vertical displacement sensors 395 and 396, and the temperature sensors 397-399 were formed, are as illustrated in FIG. 2, etc.

Further, each of the wiring widths W of the temperature sensors 397-399 (refer to FIG. 7) was adjusted to 12 μm, and each of the wiring lengths was adjusted to 4000 μm. It should be noted that the wiring length of the temperature sensor 397 means a length of a line that goes through the center of the wiring width W in the meandering pattern having the wiring width W that connects between the terminal 397TA and the terminal 397TB in the plan view of FIG. 7 (*a*). The same can be applied to the temperature sensors 398 and 399. Further, as the temperature measurement circuit 17, a two-conductor type temperature measurement circuit as illustrated in FIG. 9 was used.

Figure 10:
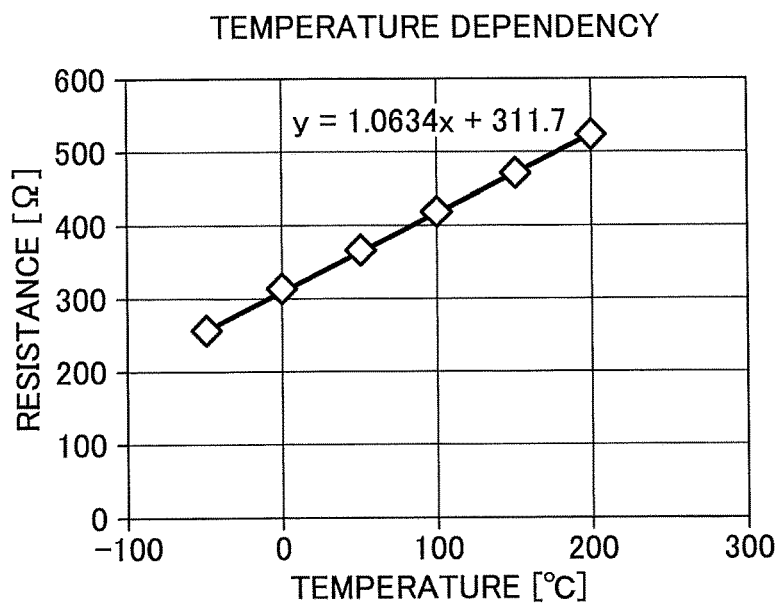
FIG. 10 is a graph illustrating an example of the temperature dependency of the temperature sensor 397.

FIG. 10 is a graph illustrating an example of the temperature dependency of the temperature sensor 397. As illustrated in FIG. 10, it was confirmed that the resistance of the temperature sensor 397 changed linearly with respect to the temperature. The resistance of the temperature sensor 397 depends on the platinum (Pt) alone in FIG. 10. The resistance of the lanthanum nickel oxide (LNO) is high and does not affect the entire resistance of the temperature sensor 397. It should be noted that the similar results were obtained with respect to the temperature sensors 398 and 399.

Figure 11:
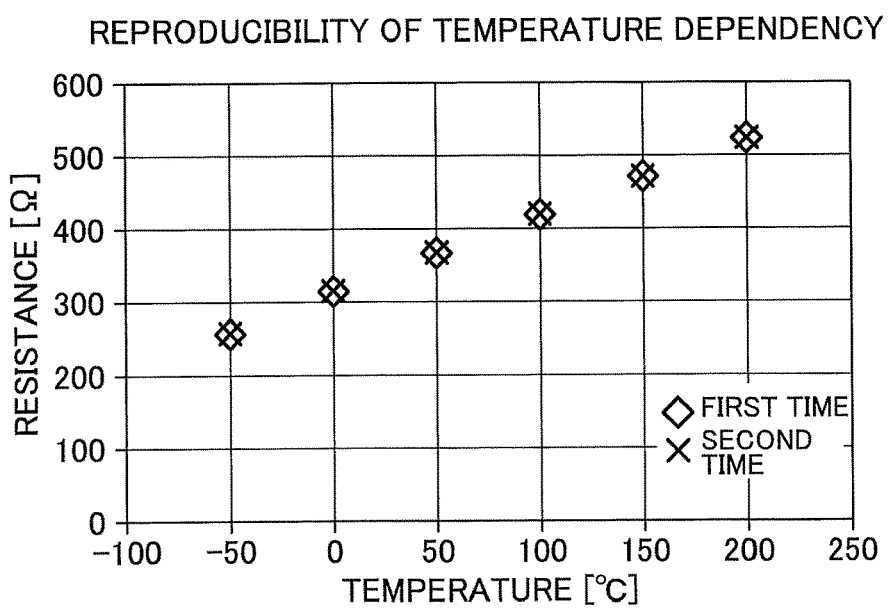
FIG. 11 is a graph illustrating an example of reproducibility of the temperature dependency of the temperature sensor 397.

FIG. 11 is a graph illustrating an example of reproducibility of the temperature dependency of the temperature sensor 397, in which changes of the resistance of the temperature sensor 397 with respect to the temperature were measured and plotted twice. As illustrated in FIG. 11, it was confirmed that the temperature dependency of the resistance of the temperature sensor 397 had a precise reproducibility based on the repeated measurements. It should be noted that the similar results were obtained with respect to the temperature sensors 398 and 399.

Further, a first sample was prepared, in which each of the wiring lengths of the temperature sensors 397-399 was adjusted to 6000 μm, and a second sample was prepared, in which each of the wiring lengths of the temperature sensors 397-399 was adjusted to 8000 μm. The wiring length dependencies of the resistances of the temperature sensors 397-399 were studied (it should be noted that the wiring thickness and the wiring width were as described above). Further, the ambient temperatures of the temperature sensors 397-399 were 0° C.

Figure 12:
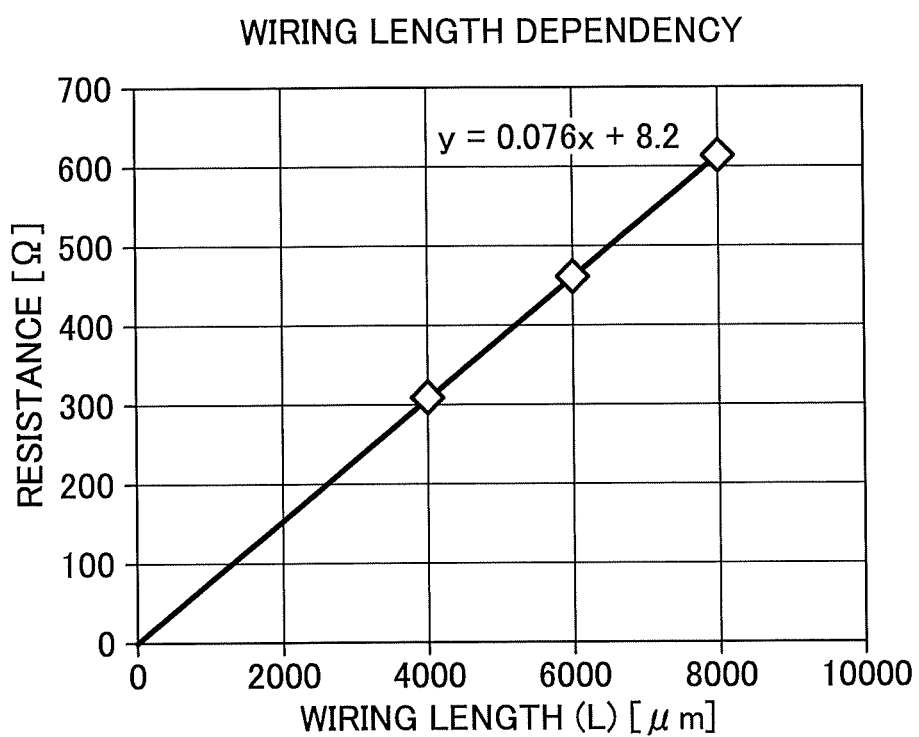
FIG. 12 is a graph illustrating an example of wiring length dependency of the temperature sensor 397.

FIG. 12 is a graph illustrating an example of the wiring length dependency of the temperature sensor 397. As illustrated in FIG. 12, it was confirmed that the resistance of the temperature sensor 397 changed linearly with respect to the wiring length. It should be noted that the similar results were obtained with respect to the temperature sensors 398 and 399. Referring to FIG. 12, resistance bodies, whose resistance is 100Ω at 0° C., can be realized as the temperature sensors 397-399 by adjusting the wiring thickness to 150 nm (adjusting the thickness of the platinum (Pt) to 150 nm), the wiring width W to 12 μm, and the wiring length to 1200 μm.

As described above, it has been confirmed that, by forming the temperature sensors 397-399 having the same layer structure as the lower electrodes of the horizontal displacement sensor 391 and the vertical displacement sensors 395 and 396, the temperatures of the vicinities of the horizontal displacement sensor 391 and the vertical displacement sensors 395 and 396 can be accurately detected.

It should be noted that the above described embodiments are preferable embodiments of the present invention. However, the present invention is not limited to the above embodiments, and various modifications may be possible within a range without departing from the spirit of the present invention.

For example, in the above embodiments, an example is illustrated in which an optical scanning control device according to an embodiment of the present invention is applied to a laser scanning projector. However, an optical scanning control device according to an embodiment of the present invention is not limited to the above example. For example, an optical scanning control device according to an embodiment of the present invention may be applied to various devices that display an image on a screen. For example, an in-vehicle head-up display, a laser printer, a laser scanning depilator, a laser head lamp, a laser radar, etc., may be listed as such devices.

Further, in an embodiment of the present invention, an example is illustrated in which three lasers are included. However, at least one laser may be included. In this case, a single color optical scanning control device may be realized.

The present application is based on and claims the benefit of priority of Japanese Priority Application No. 2015-109503 filed on May 29, 2015, the entire contents of which are hereby incorporated herein by reference.

DESCRIPTION OF THE REFERENCE NUMERALS

1 optical scanning control device
10 circuit unit
11 system controller
12 CPU
13 buffer circuit
14 mirror drive circuit
15 laser drive circuit
16 temperature control circuit
17 temperature measurement circuit
20 light source unit
21 LD module
22 temperature control unit
23 temperature sensor
24 dimming filter
30 optical scanning device
40 optical unit
41, 42, 43 reflection mirror
44 concave mirror
50 screen
60 light amount detection sensor
100 housing
150 unit
211R, 211G, 211B laser
215 light amount detection sensor
310 mirror
320 mirror support unit
322 slit
330A, 330B twist beam
340A, 340B connection beam
350A, 350B, 370A, 370B drive beam
351A, 351B, 371R, 371L drive source
360 movable frame
380 fixed frame
391 horizontal displacement sensor
392, 393, 394 dummy sensor
395, 396 vertical displacement sensor
397, 398, 399 temperature sensor
397A first layer
397B second layer
397TA, 397TB terminal

What is claimed is:

1. An optical scanning device that scans incident light by causing a mirror to oscillate, the optical scanning device comprising:
   a displacement sensor configured to detect a swing angle of the mirror; and a temperature sensor used for temperature compensation of the displacement sensor, wherein the displacement sensor has a structure in which a lower electrode, a piezoelectric film, and an upper electrode are layered in this order, and the temperature sensor is a resistance type temperature measuring body having a same layer structure as the lower electrode.

2. The optical scanning device according to claim 1, wherein the temperature sensor is formed on a same plane as the displacement sensor.

3. The optical scanning device according to claim 1, wherein a plurality of the displacement sensors and a plurality of the temperature sensors are provided, and, to each of the displacement sensors, a corresponding temperature sensor is assigned.

4. The optical scanning device according to claim 3, wherein the plurality of the displacement sensors include a horizontal displacement sensor that detects a swing angle of the mirror in a horizontal direction, and a vertical displacement sensor that detects a swing angle of the mirror in a vertical direction.

5. The optical scanning device according to claim 1, wherein the temperature sensor includes a layer made of platinum.

6. The optical scanning device according to claim 1, further comprising:

a horizontal drive beam that includes a horizontal drive source for causing the mirror to oscillate in a horizontal direction; and a vertical drive beam that includes a vertical drive source for causing the mirror to oscillate in a vertical direction, wherein lower electrodes of the horizontal drive source and the vertical drive source have the same layer structure as the temperature sensor.

7. An optical scanning control device comprising:

the optical scanning device according to claim 1;

a temperature measurement circuit configured to measure a temperature of the displacement sensor based on a resistance value of the temperature sensor; and a control unit configured to control the swing angle of the mirror by applying temperature compensation to an output of the displacement sensor based on an output of the temperature measurement circuit.

8. The optical scanning control device according to claim 7, wherein the temperature measurement circuit is a two-conductor type temperature measurement circuit.

9. A manufacturing method of an optical scanning device that scans incident light by causing a mirror to oscillate, the manufacturing method comprising:

forming a displacement sensor that detects a swing angle of the mirror;

forming a temperature sensor used for temperature compensation of the displacement sensor;

forming a horizontal drive beam that includes a horizontal drive source for causing the mirror to oscillate in a horizontal direction; and forming a vertical drive beam that includes a vertical drive source for causing the mirror to oscillate in a vertical direction, wherein the displacement sensor, the horizontal drive source, and the vertical drive source are piezoelectric elements that have a structure in which a lower electrode, a piezoelectric film, and an upper electrode are layered in this order, the temperature sensor is a resistance type temperature measuring body that has a same layer structure as the lower electrodes of the displacement sensor, the horizontal drive source, and the vertical drive source, and the temperature sensor is formed at the same time in a same process as the lower electrodes of the displacement sensor, the horizontal drive source, and the vertical drive source.

* * * * *